United States Patent [19]

Okumura et al.

[11] Patent Number: 4,937,652

[45] Date of Patent: Jun. 26, 1990

[54] SEMICONDUCTOR DEVICE AND METHOD OF MANUFACTURING THE SAME

[75] Inventors: Katsuya Okumura, Yokohama; Toshinori Shinki, Tokyo; Toshiaki Idaka, Yokohama; Riichirou Aoki, Kitakami, all of Japan

[73] Assignee: Kabushiki Kaisha Toshiba, Kawasaki, Japan

[21] Appl. No.: 251,179

[22] Filed: Sep. 30, 1988

[30] Foreign Application Priority Data

Oct. 2, 1987 [JP] Japan .................. 62-249329

[51] Int. Cl.$^5$ ................ H01L 23/48; H01L 29/44; H01L 29/52; H01L 29/60
[52] U.S. Cl. ........................... 357/68; 357/65; 357/67; 357/71
[58] Field of Search .............. 357/65, 67, 68, 71

[56] References Cited

U.S. PATENT DOCUMENTS 4,742,023  5/1988  Hasegawa ................ 357/67
4,845,543  7/1989  Okikawa et al. .......... 357/67

Primary Examiner—William L. Sikes
Assistant Examiner—Robert E. Wise

Attorney, Agent, or Firm—Foley & Lardner, Schwartz, Jeffery, Schwaab, Mack, Blumenthal & Evans

[57] ABSTRACT

A semiconductor device and a method of manufacturing the same wherein first and second wirings with an interlayer insulating film interposed therebetween are connected through a contact hole formed in the interlayer insulating film. In the semiconductor device, the first and second wirings are connected via a low resistive, conductive metal layer obtained by reducing a highly resistive oxide layer with a highly oxidizing metal, the highly resistive oxide layer being exposed within the contact hole on the surface of the first wiring. In the method of manufacturing a semiconductor device, a contact hole is opened in the interlayer insulation on the first wiring, a highly oxidizing metal is deposited on the highly resistive oxide layer on the surface of the first wiring within the contact hole, and the highly resistive oxide layer is reduced with the highly oxidizing metal to change the highly resistive oxide layer to a low resistive, conductive metal layer. The second wiring is connected to the first wiring via the conductive metal layer. The reduction may be carried out before or after depositing the second wiring, or at the time when the highly oxidizing metal is deposited.

16 Claims, 3 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same and more particularly, to a semiconductor device having a multilayer wiring structure and a method of manufacturing the same.

2. Description of the Prior Art

A conventional multilayer interconnection structure of a semiconductor device will be described with reference to FIG. 3. A first aluminum wiring 2 is formed on a semiconductor substrate 1, and an interlayer insulating film 3 whose main components are silicon oxide film is formed over the aluminum wiring 2. A second aluminum wiring 4 formed on the interlayer insulating film 3 is electrically connected to the first aluminum wiring 2 via a contact hole 5 opened in the insulating interlayer film 3 so as to electrically connect the first aluminum wiring and the second aluminum wiring.

The yield (conduction probability) of conduction decreases rapidly as the diameter of the contact hole 5 becomes very small as shown in FIG. 4. In FIG. 4, line (1) passing through white circles represents the case where the second aluminum wiring is deposited after sputter etching, and line (2) passing through black circles represents the case without sputter etching. As seen from line (2), there scarcely occurs conduction with the contact hole diameter of 1 micron, namely the conduction yield becomes 99.9 % or less. The reason for this is that after the contact hole 5 is formed, the surface of the first aluminum wiring 2 is in contact with air through the contact hole 5 until the second aluminum wiring 4 is formed thereon so that an alumina layer is formed on the surface of the first aluminum wiring 2 to prevent conduction between the first and second aluminum wirings 2 and 4. However, as the diameter of the contact hole 5 becomes large, it is likely for the alumina layer to have some defects such as pin holes or cracks through which conduction between the first and second aluminum wirings is allowed. In consideration of this, conventionally the alumina layer on the first aluminum wiring 2 has been removed by sputter etching with Ar ions. Thereafter, while shielding the alumina layer from air, i.e., maintaining in vacuum, the second aluminum wiring 4 is formed on the alumina layer under the same vacuum condition. With the above processes, the conduction yield was made in the order of 99.99 % even with the contact hole diameter of 1 micron as shown in FIG. 4, at line (1).

To further improve the yield of conduction, various sputter etching methods are now being developed. Although the conduction yield can be improved by such methods, it has been found that another problem may arise. Namely, where the first aluminum wiring 2 is connected to the gate electrode, a great amount of Ar ions through the sputter etching are implanted in the first aluminum wiring 2 via the contact hole 5 so that the gate oxide film is charged and destroyed. Such damage due to ion implantation becomes more serious as semiconductor devices become finer and the gate oxide film becomes thinner.

As stated above, the conventional method of performing Ar ion sputter etching and removing the alumina layer on the aluminum wiring at the contact hole still poses the problem such as destroying the gate oxide film.

SUMMARY OF THE INVENTION

It is an object of the present invention to provide a semiconductor device wherein the alumina layer can be destroyed or removed without damaging the semiconductor device.

According to the semiconductor device of this invention, a highly resistive oxide layer on the surface of the first wiring is reduced with a highly oxidizing metal to form a conductive metal layer through which the first and second wirings are allowed to conduct via a contact hole in the interlayer insulating film. Therefore, the first and second wirings can reliably conduct each other without damage such as the semiconductor being damaged by ion etching.

According to the semiconductor device manufacturing method of this invention, a highly resistive oxide layer formed on the surface of the first wiring and preventing conduction between the first and second wirings, is reduced with a highly oxidizing metal to form a conductive layer. Therefore, the first and second wirings can reliably conduct each other through the conductive metal layer without giving any damage to the semiconductor device.

DESCRIPTION OF THE PREFERRED EMBODIMENTS

The first embodiment of the present invention will be described with reference to FIGS. 1A to 1C.

Figure 1A:
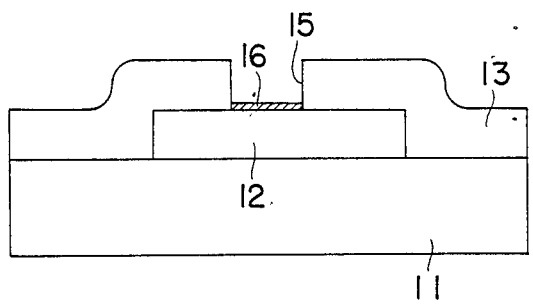
FIGS. 1A to 1C show a first embodiment of the processes of manufacturing a semiconductor device according to the present invention.

As shown in FIG. 1A, a first aluminum wiring 12 is formed on a Si semiconductor substrate 11. An interlayer insulating film 13 whose main component is silicon oxide film is formed over the aluminum wiring 12. A contact hole 15 is formed in the insulating interlayer film 13. An alumina layer 16 in the order of 80 to 100 angstroms in thickness is present on the bottom of the contact hole 15.

Figure 1B:
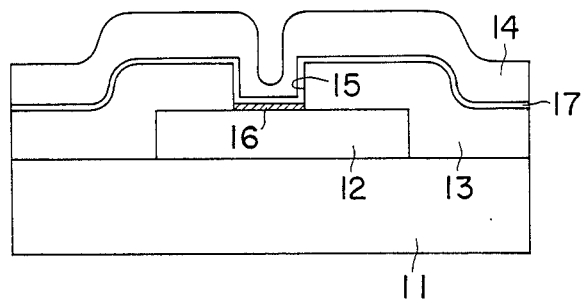
Figure 1C:
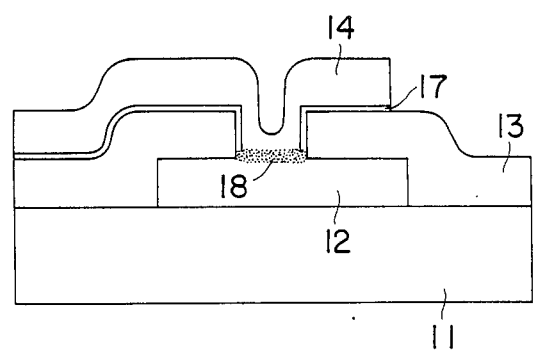

Next, as shown in FIG. 1B, a Ti film 17 is deposited on the alumina layer 16 and the interlayer insulating film 13 to a thickness of 500 angstroms by means of a sputter method. A second aluminum wiring 14 is deposited on the Ti film 17 to a thickness of 1 micron by the sputter method similar to the case of the first aluminum wiring 12, without exposing the Ti film 17 to the atmosphere.

Next, a desired wiring pattern is formed by etching the second aluminum wiring 14 and the Ti film 17.

Thereafter, the semiconductor device processed as above is subjected to heat treatment in a forming gas composed of $N_2$ and $H_2$ at 450° C. for 30 minutes. As a result, as shown in FIG. 1C, an alloy layer 18 is formed at the junction between the first and second wirings 12 and 14. The alloy layer 18 is made of titanium, aluminum and oxygen which are formed through reduction of the alumina layer 16 by the Ti film 17. The alloy layer 18 serves to considerably improve the conduction between the first and second aluminum wirings 12 and 14.

The results of experiments applied to semiconductor devices with the contact hole 15 of 1 micron in diameter showed that the probability of conduction between the first and second wirings 12 and 14 was 99.999 % or more. Checking gate oxide films with 100 angstroms thickness showed that there was no destroyed gate oxide film.

Figure 2A:
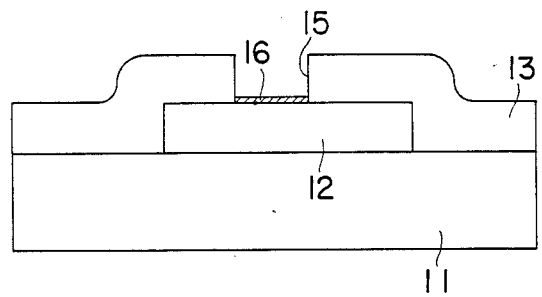
FIGS. 2A to 2C show a second embodiment of the processes of manufacturing a semiconductor device according to the present invention.
Figure 2B:
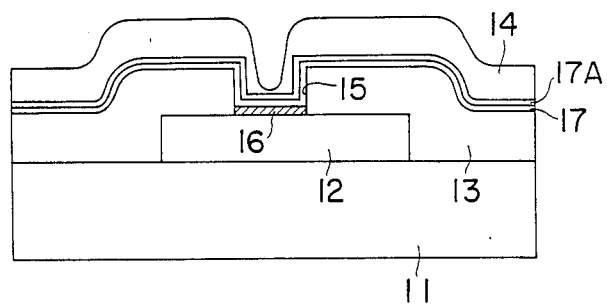
Figure 2C:
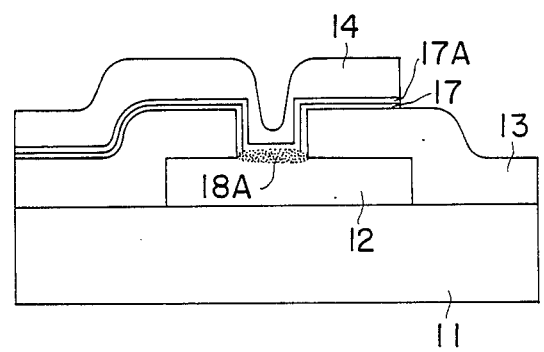

The second embodiment is shown in FIGS. 2A to 2C.

The semiconductor device shown in FIG. 2A is similar to that shown in FIG. 1A. A Ti layer 17 and TiN layer 17A are sequentially deposited on the semiconductor device shown in FIG. 2A by means of a sputter method, without exposing both the layers to the atmosphere. Thereafter, a second aluminum wiring 14 is deposited by means of a sputter method.

Next, a desired wiring pattern is formed by etching the second aluminum wiring 14, TiN layer 17A and Ti layer 17. The intermediate stage semiconductor device processed as above is subjected to heat treatment in a forming gas composed of $N_2$ and $H_2$ at 450° C. for 30 minutes. As a result, as shown in FIG. 2C, an alloy layer 18A is formed at the junction between the first and second aluminum wirings 12 and 14. The alloy layer 18 is made of titanium, aluminum and oxygen which were formed through reduction of the alumina layer 16 by the Ti film. The alloy layer 18A serves to considerably improve the conduction between the first and second aluminum wirings 12 and 14.

In the second embodiment, the TiN film 17A is not deposited directly on the first aluminum wiring 12, but the Ti film 17 is interposed therebetween. Therefore, it is possible to avoid an increase of contact resistance due to the presence of $N_2$ at the interface between the first aluminum wiring 12 and the TiN film 17A. Further, since the Ti film 17 is positioned under TiN film 17A, the contact force increases between the TiN film 17A and the insulating interlayer film ($SiO_2$) 13. Furthermore, since the TiN film 17A is positioned under the second aluminum wiring 14, the resistance against electromigration or thermalmigration is improved. Formation of an alumina layer on the first aluminum wiring 12 may be prevented if an Mo layer is formed on the first aluminum wiring. However, this is not preferable since horizontal hillocks are formed. Also, such a two-layered structure is difficult to etch and likely to produce after-corrosion. The above embodiments are free from such disadvantages.

In the first and second embodiments, the heat treatment is carried out after the second aluminum wiring was deposited. However, the heat treatment may be carried out before the second aluminum wiring 14 is deposited. Alternatively, the heat treatment may be omitted by raising the temperature of the substrate while the Ti film 17 is deposited, and enhancing the reaction of the Ti film 17 with the alumina layer 16.

Instead of the Ti film 17 used in the first and second embodiments, highly oxidizing metal such as Hf, V, Mg, Li, Ni or the like and their alloys and the like, such as HfV, AlHf, $NiSi_2$, $HfSi_2$, $VSi_2$, HfB, VB, HfC, VC, HfN and VN.

Also, instead of aluminum wiring material used in the first and second embodiments, Cu may be used and processed in the similar manner to that for aluminum.

Figure 1D:
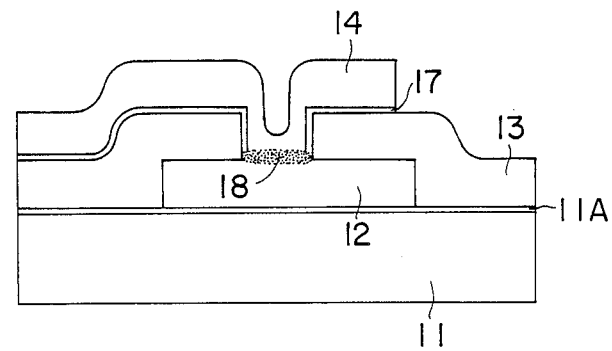
FIG. 1D is a sectional view showing a different kind of a semiconductor device manufactured by the method of the first embodiment.
Figure 2D:
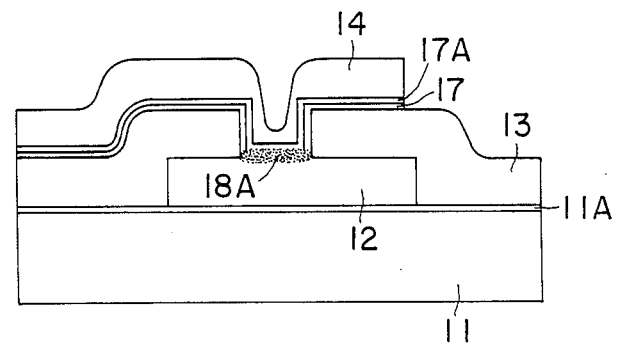
FIG. 2D is a sectional view showing a different kind of a semiconductor device according to the present invention.
Figure 3:
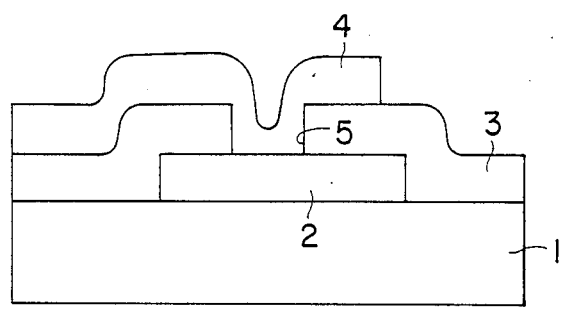
FIG. 3 is a sectional view showing a conventional semiconductor device.
Figure 4:
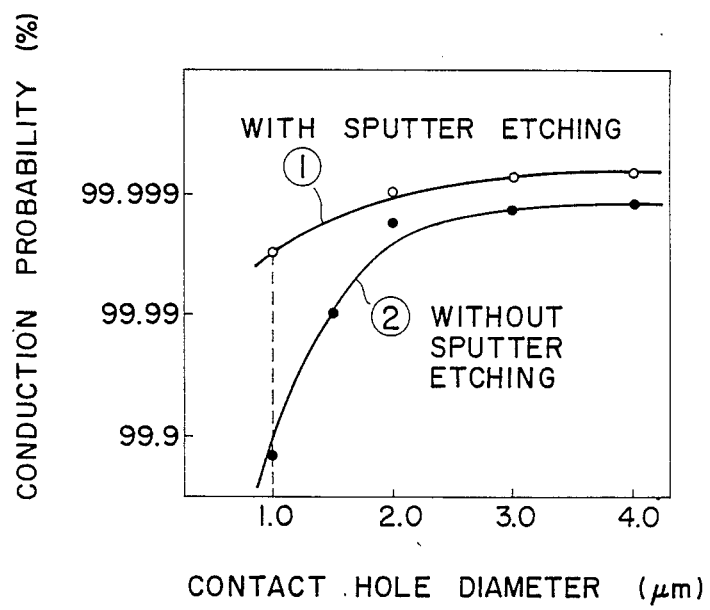
FIG. 4 is a graph showing the probability of conduction between the first and second wirings.

In the first and second embodiments, if the alumina layer 16 is thin and the Ti film 17 is excessive in quantity, the Ti film 17 reacts with Si in the substrate 11 to form alloy spikes which cause leakage in the PN junction. In view of this, a barrier layer 11A (refer to FIG. 1D and FIG. 2D) such as a TiN layer, W layer may be interposed between the first aluminum wiring 12 and the Si substrate 11 to avoid the reaction between aluminum and the Si substrate.

What is claimed is:

1. A method of manufacturing a semiconductor device comprising the steps of:
    forming an interlayer insulating film on a first wiring;
    opening a contact hole in said interlayer insulating film extending to the surface of said first wiring;
    depositing a highly oxidizing metal within said contact hole where a highly resistive oxide layer is formed on said first wiring;
    depositing a second wiring within said contact hole for obtaining conduction between said first and second wirings; and
    reducing said highly resistive oxide layer with said highly oxidizing metal to change said highly resistive oxide layer to a low resistive, conductive metal layer by means of heat treatment, said reduction step being performed at any time after said contact hole opening step.

2. A method of manufacturing a semiconductor device according to claim 1, wherein said reduction step is performed after said second wiring deposition step.

3. A method of manufacturing a semiconductor device according to claim 1, wherein said reduction step is performed after said highly oxidizing metal deposition step and before said second wiring deposition step.

4. A method of manufacturing a semiconductor device according to claim 1, wherein said reduction step is performed at the time when said highly oxidizing metal deposition step is performed.

5. A method of manufacturing a semiconductor device according to claim 1, wherein the material of said first and second wirings is selected from the group consisting of Al and Cu.

6. A method of manufacturing a semiconductor device according to claim 1, wherein said highly oxidizing metal is selected from the group consisting of Ti, V, Mg, Li, Ni, HfV, AlHf, $NiSi_2$, $HfSi_2$, $VSi_2$, HfB, VB, HfC, VC, HfN and VN.

7. A method of manufacturing a semiconductor device according to claim 1, wherein said reduction step is performed by heat treatment in a forming gas made of $N_2$ and $H_2$.

8. A method of manufacturing a semiconductor device according to claim 1, wherein said highly oxidizing metal is Ti which is deposited to the thickness of 500 angstroms, and said first and second wirings are Al, the second wiring Al being deposited to the thickness of 1 micron.

9. A semiconductor device comprising:
    a first wiring;
    an interlayer insulating film formed on said first wiring and having a contact hole extending to the surface of said first wiring;

a low resistive, conductive metal layer obtained by reducing a highly resistive oxide layer with a highly oxidizing metal, said highly resistive oxide layer being exposed within said contact hole on the surface of said first wiring; and a second wiring which conducts with said first wiring via said conductive metal layer.

10. A semiconductor device according to claim 9, wherein the material of said first and second wirings is selected from the group consisting of Al and Cu.

11. A semiconductor device according to claim 9, wherein said highly oxidizing metal is selected from the group consisting of Ti, V, Mg, Li, Ni, HfV, AlHf, $NiSi_2$, $HfSi_2$, $VSi_2$, HfB, VB, HfC, VC, HfN and VN.

12. A semiconductor device according to claim 9, wherein said highly oxidizing metal which is deposited to the thickness of 500 angstroms is Ti, and said first and second wiring materials are Al, the second wiring Al being deposited to the thickness of 1 micron.

13. A semiconductor device according to claim 9, wherein said first wiring is formed on a Si semiconductor substrate with a barrier layer of TiN interposed therebetween.

14. A semiconductor device according to claim 9, wherein said second wiring is formed on said interlayer insulating film, with said highly oxidizing metal and a barrier layer of TiN interposed therebetween.

15. A semiconductor device according to claim 9, wherein said first wiring is formed on a Si semiconductor substrate, with a barrier layer of W interposed therebetween.

16. A semiconductor device according to claim 9, wherein said second wiring is formed on said interlayer insulating film, with said highly oxidizing metal and a barrier layer of W interposed therebetween.

* * * * *